(12) United States Patent
Sparks

(10) Patent No.: US 7,935,631 B2
(45) Date of Patent: May 3, 2011

(54) METHOD OF FORMING A CONTINUOUS LAYER OF A FIRST METAL SELECTIVELY ON A SECOND METAL AND AN INTEGRATED CIRCUIT FORMED FROM THE METHOD

(75) Inventor: Terry Sparks, Niskayuna, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 300 days.

(21) Appl. No.: 11/994,764

(22) PCT Filed: Jul. 4, 2005

(86) PCT No.: PCT/EP2005/010043
§ 371 (c)(1),
(2), (4) Date: Jan. 4, 2008

(87) PCT Pub. No.: WO2007/003223
PCT Pub. Date: Jan. 11, 2007

(65) Prior Publication Data
US 2008/0224314 A1  Sep. 18, 2008

(51) Int. Cl.
*H01L 21/44* (2006.01)
(52) U.S. Cl. ............... 438/678; 257/750; 257/E21.159; 118/400; 438/653
(58) Field of Classification Search .................. 438/678, 438/653
See application file for complete search history.

(56) References Cited

U.S. PATENT DOCUMENTS

| 6,060,176 A | 5/2000 | Semkow et al. |
| 6,342,733 B1 | 1/2002 | Sambucetti et al. |
| 2002/0123220 A1 | 9/2002 | Sambucetti et al. |
| 2004/0219298 A1 | 11/2004 | Fukunaga et al. |

FOREIGN PATENT DOCUMENTS

| EP | 1126518 A | 8/2001 |
| EP | 1496542 A | 1/2005 |
| WO | 02092878 A | 11/2002 |
| WO | 03085166 A | 10/2003 |

OTHER PUBLICATIONS

Pryor et al; "Metallization of Large Silicon Wafers"; Quarterly Technical Report No. 1, Aug./Dec. 1977, Motorola, Inc.
Hsu et al; "Sn/Pd Catalyzation and Electroless Cu Deposition on TaN Diffusion Barrier Layers"; J Electrochemical Soc, 149 (3) C143 (2002).
Hong et al; "Palladium Activation on TaNx Barrier Films for Autocatalytic Electroless Copper Deposition" J Electrochemical Soc 149 (1) G85 (2002).

(Continued)

*Primary Examiner* — Matthew C Landau
*Assistant Examiner* — Sonya D McCall Shepard

(57) ABSTRACT

A cap layer for a metal feature such as a copper interconnect on a semiconductor wafer is formed by immersion plating a more noble metal (e.g. Pd) onto the copper interconnect and breaking up, preferably by mechanical abrasion, loose nodules of the noble metal that form on the copper interconnect surface. The mechanical abrasion removes plated noble metal which is only loosely attached to the copper surface, and then continued exposure of the copper surface to immersion plating chemicals leads to plating at new sites on the surface until a continuous, well-bonded noble metal layer has formed. The method can be implemented conveniently by supplying immersion plating chemicals to the surface of a wafer undergoing CMP or undergoing scrubbing in a wafer-scrubber apparatus.

14 Claims, 3 Drawing Sheets

OTHER PUBLICATIONS

Chang et al; "The Electrochemical Deposition of Nanoscaled Palladium Catalysts for 65nm Copper Metallization"; J Electrochemical Soc 150 (9) C603 (2003).

Hu et al; "Reduced electromigration of Cu wires by surface coating"; Applied Physics Letters, 81 (10) 1782 (2002).

O'Sullivan et al; "Electroless deposited diffusion barriers for microelectronic"; IBM Journal of Research and Development.

Basol et al; "Mechanically Induced Superfilling of Low Aspect Ratio Cavities in an Electrochemical Mechanical Deposition Process"; J Electrochemical Soc 151 (12) C765 (2004).

Coleman et al; "The Pd2Si (Pd) Ni Solder Plated metallization System for Silicon Solar Cells".

METHOD OF FORMING A CONTINUOUS LAYER OF A FIRST METAL SELECTIVELY ON A SECOND METAL AND AN INTEGRATED CIRCUIT FORMED FROM THE METHOD

The present invention relates to metal layer formation, particularly in the field of the manufacture of integrated circuits and, notably, the manufacture of devices including inlaid metal features (e.g. metal interconnects, capacitors, inductors, etc.), made of less noble metals such as copper (Cu).

During the manufacture of integrated circuit devices including inlaid metal features such as copper interconnects, it is generally desirable to produce a cap layer over the copper interconnects in order to prevent diffusion of copper into a dielectric layer (typically oxide) that will be deposited over the layer including the copper interconnects, and to prevent corrosion of the Cu interconnects during subsequent process steps. Conventionally, such a diffusion-barrier layer is formed over the entire wafer surface and is made of silicon nitride (SiN) or carbon-doped silicon nitride (Si(C)N). However, it has been found that there is poor adhesion of copper to these conventional materials, which results in a worsening of the electromigration failure of the copper interconnects (especially at vias).

Accordingly, it has been proposed to produce a diffusion barrier/corrosion-prevention layer on inlaid copper features by electroplating a metal cap layer selectively thereon (rather than over the entire wafer surface). Moreover, it is thought that a self-aligned process (involving deposition of caps on the Cu features rather than deposition of a layer over the entire surface) will be an essential requirement when forming proposed air-gap devices.

Existing proposals for forming a metal cap selectively on copper interconnects and the like have focussed on electroless plating of nickel (Ni), nickel-cobalt alloy (NiCo), nickel-phosphorus alloy (Ni(P)), cobalt-tungsten-phosphorus alloy (CoWP), and like materials. However, Cu is a poor catalyst for electro-oxidation. Accordingly, in order to ensure that the diffusion-barrier material plates selectively on the Cu it is common to activate the surface of the Cu lines. According to many proposals, a seed layer or "activation layer" of a noble metal, such as palladium (Pd), is first formed on the surface of the copper interconnect by an immersion plating (or "displacement plating") technique and serves to promote subsequent electroless plating of another metal (e.g. Ni(P) or Co(P)) on the copper interconnect.

However, it is difficult to control the electroless plating technique once it has been initiated. For example, plating rates can be too high, leading to non-uniform deposition, formation of an overly-thick cap layer and unwanted deposition of cap layer material on the dielectric. Furthermore, the plating proceeds both in a "vertical direction" (substantially perpendicular to the plane of the wafer surface) and in a "horizontal" direction (substantially in the plane of the wafer surface). This can lead to a shorting between neighbouring copper conductors in the case where their cap layers have been plated with a significant "horizontal" component resulting in contact between those cap layers.

In order to combat such "horizontal" or "lateral" plating during an electroless plating process it could be envisaged to form a Cu interconnect such that the Cu does not completely fill a recessed trench in which it is deposited. However, this is also a difficult technique to control, and often increases line resistance and the complexity of the fabrication process.

In general, the electroless plating techniques proposed hitherto for selectively capping Cu interconnects and the like are disadvantageous in view of their need for a relatively large number of process steps (often involving activation of the Cu surface, followed by a subsequent electroless deposition process, and multiple post-deposition cleaning steps). Moreover, the common electroless plating techniques are harmful to the environment.

In view of the above problems, the preferred embodiments of the present invention provide a new technique for forming a continuous layer of a more noble metal on a less noble metal. This technique is suitable for forming a cap layer on inlaid metal features, e.g. Cu interconnects on a semiconductor wafer.

The present invention provides a method of forming a continuous layer of a more noble metal on a less noble metal, as defined in the appended claims.

The present invention provides apparatus for forming a layer of a more noble metal on a less noble metal, as defined in the appended claims.

The present invention further provides a semiconductor wafer comprising an inlaid metal feature made of a less noble metal having a barrier layer of a more noble metal, as defined in the appended claims.

The present invention further provides an integrated circuit device comprising an inlaid metal feature made of a less noble metal having a barrier layer of a more noble metal, as defined in the appended claims.

In the preferred embodiments of the present invention a thin, dense, continuous layer of a first metal is formed on a second metal, wherein the first metal is more noble than the second metal. The first metal may be a conventionally-defined noble metal (e.g. palladium (Pd), platinum (Pt), ruthenium (Ru), silver (Ag), gold (Au), rhenium (Re), rhodium (Rh), osmium (Os), irridium (Ir)). Alternatively, the first metal may be a substance, such as nickel, which is not a conventionally-defined noble metal but which, nevertheless is "more noble" than the second metal upon which it is to be deposited using the methods of the present invention.

The second metal may be a conventionally-defined base metal or a material having relatively lower electronegativity than the first metal. Examples of suitable second metals include most metals in the same group as iron (e.g. copper (Cu), nickel (Ni), cobalt (Co), iron (Fe), manganese (Mn), chromium (Cr), etc.); as well as aluminium (Al), depending on its surface oxide; and metals in the same group as palladium but having lower electronegativity (e.g. Mo, Nb and Zr).

Provided that the first metal has a sufficiently greater electronegativity than the second metal, atoms of the first metal are attracted to available electron sites on the surface of the second metal and readily attach to the surface during immersion plating. Even a fairly small difference in electronegativity can led to the desired interreaction—e.g. 0.2 to 0.3 Pauling units when electro-negativity is being measured by the chemical thermodynamic method—although the reaction rate may be fairly slow. It is preferred to use materials having a greater difference in electronegativity, in order to obtain a faster reaction rate. For example, it is advantageous to deposit Pd onto Cu (Pd has an electronegativity of around 2.4 and Cu has an electronegativity of around 1.9).

A continuous layer of the first metal may be formed over a continuous surface made of the second, less noble metal or it may be formed on the surface of an inlaid metal feature, e.g. a Cu interconnect, and in either case it has good adhesion to the second metal. Advantageously, this continuous layer of the first metal is formed by repeatedly performing a process cycle involving an immersion plating step and an abrasion step.

In the case where the method according to the present invention is applied for capping Cu interconnects and the like, it enables the electromigration performance of the Cu interconnects to be improved, substantially without increasing defectivity or line resistance. Moreover, the use of a metal cap layer also reduces via contact resistance, and increases process margin by suppressing copper oxidation during processing. Furthermore, the barrier layer produced on the Cu interconnect constitutes a self-aligned barrier layer having the advantage of reducing the effective dielectric constant and facilitating future ultra-low-k air gap integration (it is believed that a self-aligned cap layer is a prerequisite for proposed air-gap structures).

According to a first preferred embodiment relating to the formation of a more noble metal layer on an inlaid metal feature during fabrication of a semiconductor device, the invention is implemented in a process performed after the conventional CMP ("chemical mechanical planarization" or "chemical mechanical polishing") process that serves to planarize the layer containing the inlaid metal feature, such as a Cu interconnect. For example, an immersion plating/abrasion cycle can be implemented during the brush scrub process that is often used, immediately following CMP, in order to remove residues.

According to a second preferred embodiment relating to the formation of a more noble metal layer on an inlaid metal feature during fabrication of a semiconductor device, the invention is implemented by using immersion plating chemistry during the CMP process itself. For example, immersion plating chemistry can be used in the final CMP platen.

The preferred embodiments of the invention have the additional advantage of enabling a cap layer to be formed on Cu interconnects and the like substantially without increasing the number of process steps involved in the integrated circuit fabrication process, and without requiring extra equipment. This provides a particularly cost-effective approach. Moreover, the applied method avoids the need to use conventional electroless plating techniques (e.g. electroless Ni plating) that are harmful to the environment.

The above and other features and advantages of the present invention will become apparent from the following description of preferred embodiments thereof, given by way of example, and illustrated in the accompanying drawings, in which:

FIG. 1 is a diagram schematically illustrating an immersion plating process, in which

FIG. 2 is a diagram schematically illustrating the formation of a continuous layer of a noble metal by the process according to the present invention, in which

Figure 3:
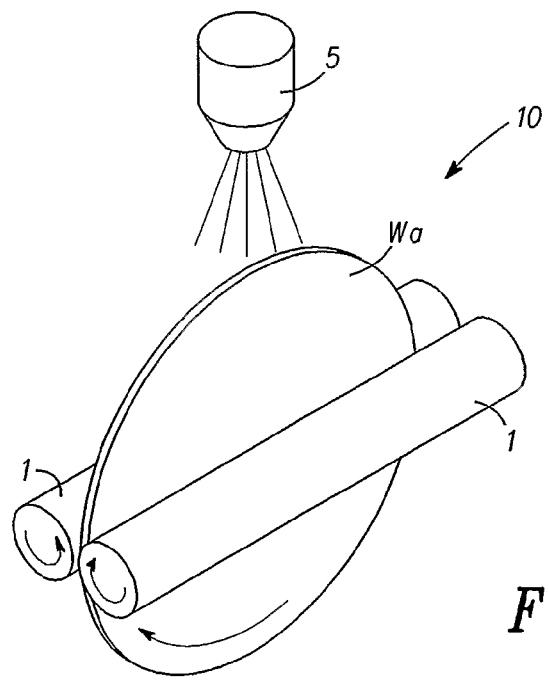
Figure 4A:
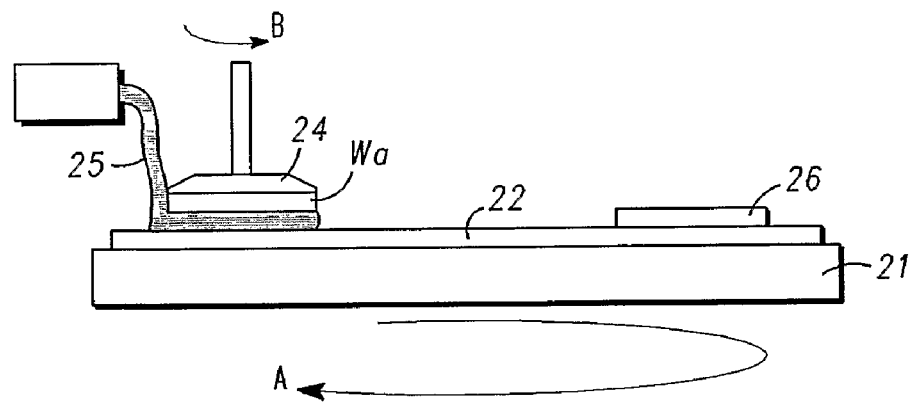
Figure 4B:
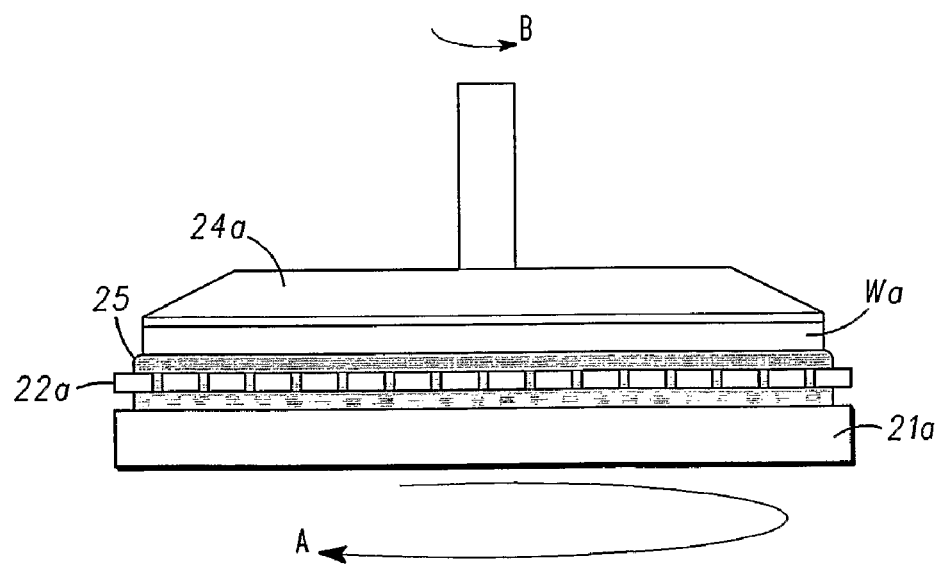

FIG. 3 illustrates an example of apparatus suitable for performing a method according to a first preferred embodiment of the present invention; and FIG. 4 illustrates examples of apparatus suitable for performing a method according to a second preferred embodiment of the present invention, in which FIGS. 4A and 4B represent respective examples of different known CMP equipment adapted to perform the method.

Figure 1A:
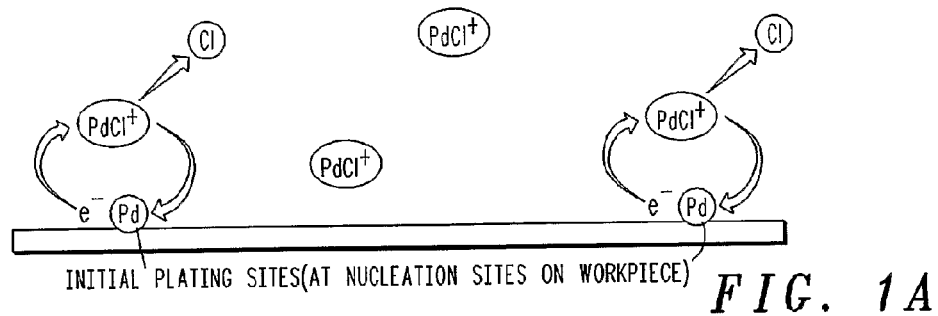
FIGS. 1A to 1C show different stages in the formation of loose nodules.
Figure 1B:
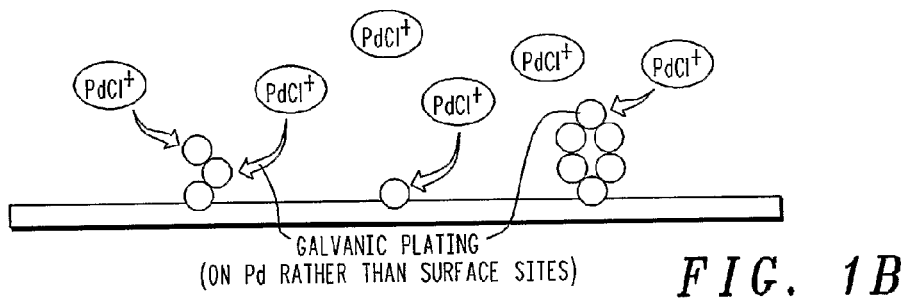

The immersion plating process will now be discussed with reference to FIG. 1 in order to enable the present invention to be better understood.

As an example of a conventional immersion plating process, consider a known process serving to form a layer of Pd all over the surface of a workpiece made of a conductive material. Typically, the workpiece is immersed in a bath containing a dilute aqueous acidic solution of palladium ions (e.g. a dilute aqueous HCl solution containing $PdCl_2$). Zerovalent Pd plates onto the surface of the workpiece at nucleation sites which, typically, correspond to sites of free or dangling bonds, i.e. electro-negative sites or sites of electrons that will form a chemical bond with the Pd atom.

Figure 1C:
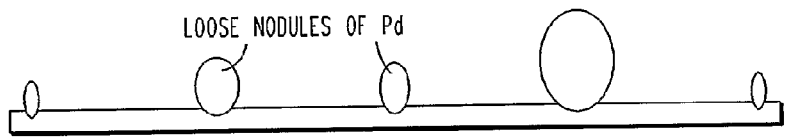
Figure 2A:
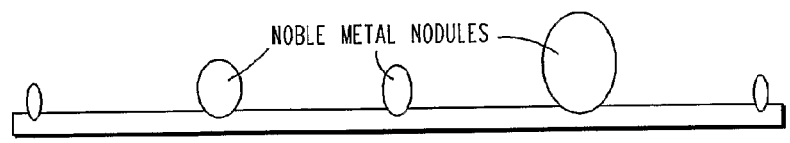
FIGS. 2A to 2F show different stages in the formation of the continuous layer.

It has been shown that the immersion-plated layer is not a continuous layer of the plated metal. On the contrary, the plated metal forms loose nodules on the workpiece, as illustrated in FIG. 1C and FIG. 2A. It is believed that the reason for this is, as follows.

When the workpiece is immersed in the immersion plating bath a certain number of $PdCl^+$ ions are attracted to nucleation sites on the workpiece surface; the nucleation sites correspond to features such as surface vacancies, dislocations, etc. that can easily provide a free electron. As a result, a Pd atom attaches to the workpiece surface and a chlorine atom is liberated—see FIG. 1A. The Pd atoms are bonded firmly at these initial bonding sites (It is believed that the liberated Cl atom dissolves in the dilute aqueous immersion-plating solution. Alternatively, it may produce a molecule of chlorine gas. In any event, the quantities of liberated chlorine are relatively small and, in experiments, were not found to produce a detectable change in the acidity of the immersion bath or detectable gas emissions).

Once Pd atoms have bonded to the workpiece surface, it is easier for free electrons from the workpiece to react with further $PdCl^+$ ions at these initial bonding sites, rather than at new locations on the workpiece surface. In effect, a kind of localized galvanic plating mechanism comes into operation and further Pd atoms bond onto the Pd atoms at the initial sites, resulting in the formation of nodules—see FIG. 1B. As a result, instead of a continuous Pd layer building up over the entire workpiece surface, nodules of loosely bound Pd build up with gaps in-between them, as illustrated in FIG. 1C. Moreover, the nodules may also include some PdCl molecules. It should be noted that it is only the Pd atoms closest to the workpiece surface that have good adhesion to that surface.

Because it is simple and cost-effective, immersion plating has been used in integrated circuit fabrication for deposition of noble metals directly on copper, TaN barrier layers, etc. Even though the immersion-plated noble-metal layer is composed of loose nodules, it can serve as a seed layer promoting the subsequent electroless plating of another material onto the workpiece (as mentioned above).

According to the present invention, immersion plating can be used to form a continuous layer of a more noble metal on a less noble metal. This is achieved by performing multiple immersion plating steps and breaking up loose nodules of the plated more noble metal between the immersion plating steps.

In preferred embodiments of the invention, the immersion plating process is combined with mechanical abrasion. The mechanical abrasion prevents the formation of large nodules of the immersion-plated more noble metal and promotes electrical plating. Moreover, in an application that seeks to selectively plate a more noble metal onto an inlaid Cu feature, e.g. an interconnect, rather than onto surrounding dielectric, the mechanical abrasion prevents plating from occurring at damage sites on the dielectric surface, thus providing a low defectivity process.

FIG. 2 illustrates schematically how a continuous layer of a first metal can be formed on a second, less noble metal according to the above-described technique, using immersion bath chemistry suitable for plating the selected more noble metal (in this example, palladium, a conventionally-defined noble metal).

FIG. 2A illustrates the state of the workpiece's surface after an initial immersion plating step has been performed—loose nodules of palladium are bonded to that surface.

Figure 2B:
Figure 2C:
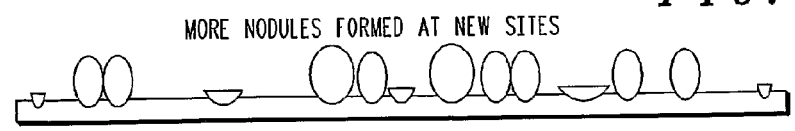
Figure 2D:
Figure 2E:
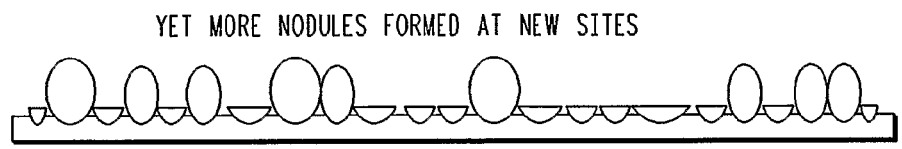
Figure 2F:
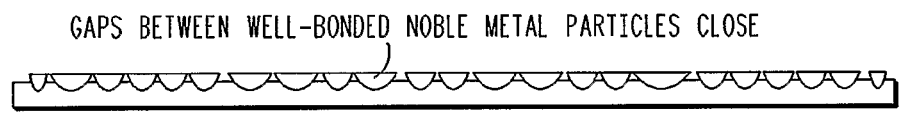

Next, mechanical abrasion or the like is used in order to remove the loose nodule material, leaving the well-bonded palladium atoms at the initial surface bonding sites, as illustrated in FIG. 2B. A subsequent immersion plating step leads to formation of more loose nodules attached at new sites on the workpiece's surface—see FIG. 2C. More mechanical abrasion will now remove the loose material from these new nodules, leaving the well-bonded noble palladium at the initial surface bonding sites and the second set of bonding sites, as illustrated in FIG. 2D. Further immersion plating steps will lead to formation of yet more nodules of palladium at additional sites on the workpiece's surface—see FIG. 2E. As more cycles of immersion plating and mechanical abrasion are performed, palladium atoms will bond to the workpiece surface at a greater and greater number of sites, the gaps between sites will close (see FIG. 2F) and, eventually, the whole surface will be covered.

Experiments were performed implementing the above-described process to plate palladium onto a silicon surface; performing an immersion-plating step followed by a rinse step and then a mechanical wiping step before implementing the next immersion-plating step. In the rinsing step, deionized water was cascaded over the workpiece so as to rinse off the acidic plating solution, but had no mechanical effects on the workpiece surface. These experiments showed that after 3 to 4 series of immersion plating/mechanical wiping steps a continuous layer of Pd was formed on the silicon and this continuous layer was 10-20 nm thick. It has been found that this process is faster when plating Pd onto copper.

The present inventors consider that the combination of mechanical wiping with multiple immersion plating cycles can produce a continuous thin layer of a noble metal (notably Pd or Pt) on inlaid Cu features. The thus-formed noble metal cap layer has very low contact resistance and has good barrier properties:—when a thin Pd layer formed by the technique of the present invention was tested as a barrier to prevent plated Ni and Cu diffusion into an ultra-shallow p-type junction after anneals performed at 350° C. to 400° C. it was found to provide an effective barrier. It is believed that Cu interconnects having cap layers produced by this technique will give results equivalent to those obtained using thicker layers of Pd or Ni formed by electroless deposition. Typically, a continuous cap layer of Pd (or another noble metal) that is 10-30 nm thick and formed by methods according to the present invention should be sufficient to inhibit copper diffusion and improve electromigration failure performance.

In practice, the methods according to the preferred embodiments of the present invention involve substantially simultaneous performance of immersion plating and mechanical abrasion at a global level. Therefore, considering the wafer as a whole, at any given moment immersion plating is occurring and nodules are being broken up by mechanical abrasion. However, at a particular location on the copper surface it can be considered that there are successive steps of immersion plating and rupturing of loose nodular material, as described above with reference to FIG. 2A to FIG. 2F.

In conventional noble-metal immersion plating processes, performed so as to form a seed layer for subsequent electroless plating, the duration of the exposure of the copper interconnect to the immersion-plating chemicals is selected so as to strike a balance between two requirements: the need to have a sufficient degree of plating so as to activate the copper for the subsequent electroless plating process, and the need to limit the formation of large noble-metal nodules which will result in poor adhesion between the Cu and the electrolessly-plated cap layer material. Bulk film adhesion tests can be performed so as to help determine the immersion conditions that are adequate to balance these two factors. Some attempts have been made to find post-immersion-plating treatments that could "stabilise" the plated noble metal before the electroless plating step.

According to the present invention, increasing the duration of the immersion-plating process will not lead to a reduction in the adhesion between the copper and the immersion-plated material (or a material overlying that immersion-plated material), because the loose nodular material is being removed from the copper surface (e.g. by mechanical abrasion) as the immersion plating progresses. Extending the duration of the immersion plating/nodule-rupturing process will merely lead to formation of a thicker layer of plated noble metal. However, in practice, the process conditions will typically be set so as to form a continuous layer of the more noble metal that is approximately 20 nm thick.

The method according to the present invention can be implemented in a variety of ways adapted to suit the context in which it is being applied. For example, the first and second preferred embodiments of the invention discussed below relate to the formation of a layer of a more noble metal over a less noble metal during the processing of a semiconductor wafer. In these first and second preferred embodiments the loose nodules of the more noble metal are broken up using abrasion and the steps required to form the continuous layer of the more noble metal are integrated into processes that are already being performed during the overall integrated circuit fabrication process.

According to the first preferred embodiment, the method of the present invention is performed in wafer-scrubber apparatus that is conventionally used for removing residues from the wafer surface after CMP.

FIG. 3 is a diagram schematically representing the main components in a wafer scrubber apparatus 10 adapted for use in the first preferred embodiment of the invention. (This wafer scrubber apparatus 10 is an adapted version of one example of a conventional wafer scrubbing apparatus; it is to be understood that the present invention can be implemented by appropriate adaptation of other designs of wafer scrubbing apparatus).

In this apparatus 10 the wafer, Wa, is supported between a pair of cylindrical scrubber brushes 1 which rotate in opposite directions. Typically the surface of these cylindrical brushes or rollers is made from a soft polymer material (e.g. polyvinyl acetate, PVA, or polyurethane). The wafer is rotated about its axis.

In conventional wafer-scrubber apparatus of the type that has been adapted and represented in FIG. 3, cleaning liquids such as deionized water with a surfactant are directed via nozzles towards the wafer surface and are swept across that surface by the brushes 1 with a high lateral flow force (even though, in general, the brushes do not actually contact the wafer surface). Moreover, cleaning fluids are often supplied through the brushes 1 as well as via nozzles.

In the first preferred embodiment of the invention, immersion plating chemicals suitable for plating a more noble metal onto a copper surface are inserted into the wafer scrubber tool. For example, if it is desired to form a cap layer made of palladium, a mixture of dilute aqueous HCl and $PdCl_2$ can be used. More particularly, the mixture of dilute HCl and $PdCl_2$ may be directed towards the wafer surface via one or more nozzles 5 directed towards the wafer and/or the brushes. Preferably, this is a separate set of nozzles from that (or those) supplying the standard post-CMP cleaning solution to the wafer, in order to reduce consumption of the immersion-plating solution. Alternatively or additionally the mixture of dilute HCl and $PdCl_2$ may be supplied through the brushes.

Based on data from conventional electroless plating sensitization processes, and taking into account the typical immersion plating rates of Pd on copper, it is expected that the process time required to form a continuous layer of Pd of around 20 nm thickness on inlaid Cu features on a wafer will be around 30-60 seconds, or slightly longer, when the apparatus of FIG. 3 (which involves no mechanical contact between the brushes and the wafer) is used to implement the method according to the first preferred embodiment of the invention. This is because the plating and removal of loose material are occurring simultaneously. In this case, the force removing loose nodular material from the wafer surface comes from the high fluid velocity between the rotating brush/roller that is in close proximity to the wafer surface.

It should be noted that the defectivity currently observed on wafers emerging from the CMP process is such that it is preferred to give the wafers a standard post-CMP clean before supplying the immersion plating chemicals to the apparatus of FIG. 3.

Although a continuous layer of a more noble metal can be formed on Cu interconnects by the above-described first embodiment, there are nevertheless certain drawbacks. It is likely that oxide will form on the surface of the copper interconnects after CMP and before the wafer has entered the wafer scrubber apparatus. The plating chemicals can remove a certain amount of copper oxide. However, if between CMP and wafer scrubbing there is an extended interval when the copper interconnects are exposed to ambient air then this may interfere with the subsequent process for plating the more noble metal. Accordingly, it can be advantageous to make use of the second preferred embodiment of the invention.

According to the second preferred embodiment of the invention, immersion plating chemistry is applied to the surface of the semiconductor wafer during copper CMP.

FIGS. 4A and 4B illustrate two different examples of CMP apparatus, 20 and 20a, adapted to implement the method according to the second preferred embodiment of the invention. The delivery and concentration of the immersion plating solution may be slightly easier to control using the apparatus 20a of FIG. 4B. Each of these examples 20, 20a of CMP apparatus is an adapted version of a known CMP apparatus; it is to be understood that the present invention can be implemented by appropriate adaptation of other designs of CMP apparatus.

In the adapted CMP apparatus 20/20a a platen 21/21a supports a polishing pad 22/22a and is driven in rotation, in the direction indicated by arrow A in FIGS. 4A and 4B, by a motor (not shown). Typically, the method according to the second preferred embodiment of the invention will be implemented using a polishing pad 22/22a that is the final buff pad of the CMP process. The semiconductor wafer, Wa, is placed in a wafer holder 24/24a which serves to rotate the wafer, in the direction indicated by arrow B in FIGS. 4A and 4B, under the action of a motor (not shown). The apparatus 20 shown in FIG. 4A has a pad conditioner 26 to recondition the surface of the polishing pad 22.

According to the second preferred embodiment of the present invention, immersion plating chemicals 25 suitable for plating a more noble metal onto a copper surface are supplied so as to flow into the narrow space between the polishing pad 22/22a and the surface of the wafer. For example, if it is desired to form a cap layer made of palladium, an industry-standard solution of dilute aqueous HCl and $PdCl_2$ can be used. In the CMP apparatus 20 of FIG. 4A, the immersion plating chemicals are typically poured onto the surface of the polishing pad 22. In the CMP apparatus 20a of FIG. 4B, the immersion plating chemicals are typically supplied to the surface of the wafer from the platen 21a, via holes in the polishing pad 22a.

In conventional CMP apparatus, the final process step is a buffer and/or rinse step that serves to adjust the final planarity of the wafer and to remove residual barrier layer material. Often this final buffer/rinse step does not involve use of a reactive slurry. It is preferred if the normal final rinse/buffer process step is performed using the apparatus of FIG. 4A/FIG. 4B before the immersion-plating solution is supplied between the polishing pad 22/22a and the wafer in a second, rinse step.

Based on data from conventional electroless plating sensitization processes, and taking into account the typical immersion plating rates of Pd on copper, it is expected that the process time required to form a continuous layer of Pd of around 20 nm thickness on inlaid Cu features on a wafer will be around 30-60 seconds or slightly longer when the apparatus of FIGS. 4A and 4B (which involves mechanical polish with low CMP down force) is used to implement the method according to the second preferred embodiment of the invention. Once again, this is because the plating and removal of loose material are occurring simultaneously.

The second preferred embodiment provides a number of advantages additional to those provided by the first preferred embodiment.

Firstly, according to the first embodiment of the invention, at the time when the Cu surface is coated with Pd it is in a relatively reactive condition and may actually attract residues. By way of contrast, if the Cu interconnects are coated with the more noble metal layer during CMP, using the method of the second preferred embodiment of the invention then, when the wafer is placed in the wafer-scrubbing apparatus for post-CMP cleaning, the more noble metal layer provides excellent surface passivation, to the extent that it may actually reduce the amount of post-CMP cleaning that is required. In other words, by performing the Pd plating in the final CMP platen it is believed that the defectivity of the wafers emerging from the CMP process may be reduced.

Secondly, because the second embodiment of the invention involves capping the Cu interconnects during the CMP process, that is, substantially before the copper surface has been oxidized, the more noble metal can plate onto a surface which is substantially free of oxide, avoiding problems.

In both the first and second preferred embodiments of the invention, the length of time needed to accomplish formation of a continuous Pd layer is primarily dependent on the surface condition, i.e. the number of available nucleation sites, and the plating solution concentration. Bath temperature has a secondary effect (probably increasing the concentration of Pd ions), and it will typically be set at 25-30° C. so as to enable more stable control of the immersion plating solution.

In the methods according to the first and second preferred embodiments of the invention, the wafer would typically be exposed to the Pd-plating chemicals at room temperature during a period of from 30 to 90 seconds (depending upon the thickness of the Pd layer that it is desired to produce, the surface conditions and the concentration of $PdCl_2$ in the plating solution). The Pd-plating solution can be bought ready mixed or mixed at the point of use. The solution can be filtered and reused, providing an environmentally-safe procedure.

The metal cap layer produced on Cu by the methods of the present invention are very close to pure, and have a crystal structure that is amorphous or has small grains. It is believed that a metal cap layer produced by the methods of the present invention will have good adhesion to an overlying layer of dielectric material—at least as good as, if not better than, the adhesion observed when the cap layer that is used is a NiCo (P)/(B) cap layer produced by electroless plating. (Usually poor adhesion between cap layers and overlying dielectric arises because of uncontrollable oxidation or thick oxide on the copper interconnect. This is not an issue with the present invention).

A cap layer constituted by a metal layer produced by a method according to the present invention provides a continuous diffusion barrier and adherent layer to reduce the copper oxidation and poor adhesion that usually afflict Cu interconnects capped by other methods. This leads to a significant reduction in electromigration failure and other problems, such as high via resistance and void formation. The use of a metal cap layer (or "top barrier") also reduces contact resistance and increase process margin by suppressing copper oxidation during processing. Moreover, the use of a self-aligned cap can reduce RC coupling that can result from the use of high-k dielectric layers such as $Si_xN$, SiCN and the like.

The preferred embodiments of the present invention can reduce the costs normally associated with production of a cap layer on Cu interconnects. Firstly, the chemicals required for immersion plating of a noble metal such as Pd are cheaper than the chemicals required for conventional electroless plating of cap layer materials, and are less harmful to the environment. Moreover, in the first and second preferred embodiments of the invention the cap layer is produced using pre-existing equipment that is already being used to implement another step (CMP or wafer-scrubbing) in the overall fabrication process.

A semiconductor wafer, or finished integrated circuit device, including a Cu interconnect, or other inlaid metal feature, that has been capped using a method according to the present invention will be objectively different from one that includes a Cu interconnect/inlaid metal feature that has been capped by some other process. In particular, the cap layer produced using the present invention will comprise a continuous, dense layer that is substantially amorphous or has small grains, rather than a discontinuous layer having a nodular structure. This difference may affect the thickness, composition and structure of the cap layer and should be detectable using electron microscopy.

Although the present invention has been described above with reference to particular preferred embodiments thereof, it is to be understood that the invention is not limited by reference to the specific details of these preferred embodiments. More specifically, the person skilled in the art will readily appreciate that, modifications and developments can be made in the preferred embodiments without departing from the scope of the invention as defined in the accompanying claims.

For example, in the above-described preferred embodiments of the invention a Pd cap layer was formed on a Cu interconnect. However, it is to be understood that the techniques of the present invention are applicable more generally to form a continuous dense metal layer on other inlaid copper features (e.g. capacitors, inductors, etc.). Moreover these techniques are applicable to form a continuous dense layer of a more noble metal on inlaid features made of other less noble metals, e.g. gold, provided that there is sufficient electropotential difference between the inlaid metal and the depositing metal to support the plating reaction. Similarly, these techniques are suitable for forming a continuous dense layer of a more noble metal on a continuous surface made of a less noble metal.

In the above-described preferred embodiments, the invention was used to form a continuous Pd layer on an inlaid metal feature. The present invention is suitable for forming a continuous thin layer of other noble metals as conventionally-defined (e.g. Pt, Ru, Ag, Au, Re, Rh, Os, or Ir), as well as other metals (e.g. Ni) on a continuous surface or on an inlaid feature of a less noble metal, provided that appropriate immersion-plating chemicals are used to replace the dilute $HCl/PdCl_2$ mixture mentioned above. In practice, in view of the greater cost and/or scarcity of the other noble metals, Pd is liable to be preferred as the material to be deposited, using the methods of the present invention, as a non-corrosion coating for electrical connectors.

Furthermore, in the above-described preferred embodiments mechanical abrasion (either via physical contact or high-velocity fluid flow) was the process used for removing loose nodular material from a surface during immersion plating of a noble metal thereon. However, the inventors have found that simple rinsing, for example using deionized water, diluted HCl or other suitable rinsing agents, can lead to a slight increase in noble metal plating sites as the number of immersion plating cycles increases (i.e. as the duration of the immersion plating process increases). Thus, a variant of the present invention would involve combining multiple immersion plating cycles with rinsing, perhaps rinsing using liquids applied under pressure. However, it should be noted that when using such a variant method it would take longer to produce a continuous layer of noble metal than in the methods of the above-described preferred embodiments.

The invention claimed is:

1. A method of forming a continuous layer of a first metal selectively on a second metal, said first metal being more noble than said second metal, the method comprising the steps of:
    immersion plating said first metal onto said second metal, and
    breaking up nodules of said first metal on the surface of the second metal;
    wherein:
        during a first time period, immersion plating and breaking up the nodules comprises forming a first set of nodules, such that the first metal is a discontinuous layer, and reducing a height of nodules within the first set of nodules; and
        immersion plating and breaking up the nodules are continued after the first time period, such that additional nodules are formed between nodules within the first set of nodules until a continuous layer of the first metal is formed.

2. The method of forming a continuous layer of said first metal on said second metal according to claim 1, wherein said first metal has greater electronegativity than said second metal.

3. The method of forming a continuous layer of said first metal on said second metal according to claim 1, wherein the step of breaking up nodules of said first metal comprises performing mechanical abrasion.

4. The method of forming a continuous layer of said first metal on inlaid metal features of a semiconductor wafer, said inlaid metal features being formed of said second metal, according to claim 1, wherein the steps of immersion-plating and of breaking up nodules are implemented by exposing the inlaid metal feature to immersion plating chemicals suitable for immersion plating said first metal, during chemical mechanical planarization of the wafer layer including said inlaid metal feature.

5. A semiconductor wafer comprising an inlaid feature of a second metal, said inlaid feature having a barrier layer comprising a continuous layer of a first metal, said first metal being more noble than said second metal, said continuous layer being formed by the method of claim 1.

6. An integrated circuit device comprising an inlaid feature of a second metal, said inlaid feature having a barrier layer comprising a continuous layer of a first metal, said first metal being more noble than said second metal, said continuous noble metal layer being formed by the method of claim 1.

7. The method of claim 1, further comprising rotating a pair of brushes in opposite directions while a semiconductor wafer including the second metal is disposed between the pair of brushes.

8. The method of forming a continuous layer of said first metal on said second metal according to claim 2, wherein said first metal is selected in the group consisting of: palladium, platinum, ruthenium, silver, gold, rhenium, rhodium, osmium, iridium and nickel.

9. The method of forming a continuous layer of said first metal on inlaid metal features of a semiconductor wafer, said inlaid metal features being formed of said second metal, according to claim 4, wherein the immersion plating step consists in immersion plating palladium onto an inlaid copper feature.

10. A semiconductor wafer according to claim 5, wherein said continuous first metal layer is a layer of Pd.

11. A semiconductor wafer according to claim 5, wherein said inlaid metal feature is a copper feature.

12. An integrated circuit device according to claim 6, wherein said continuous first metal layer is a layer of Pd.

13. An integrated circuit device according to claim 6, wherein said inlaid metal feature is a copper feature.

14. The method of claim 7, further comprising rotating the semiconductor substrate while the semiconductor substrate is disposed between the pair of brushes.

\* \* \* \* \*